(12) United States Patent
Konno et al.

(10) Patent No.: US 8,268,644 B2
(45) Date of Patent: Sep. 18, 2012

(54) LIGHT EMITTING DEVICE, AND METHOD AND APPARATUS FOR MANUFACTURING SAME

(75) Inventors: Kuniaki Konno, Kanagawa-ken (JP); Hideo Tamura, Kanagawa-ken (JP); Hiroaki Oshio, Kanagawa-ken (JP); Tetsuro Komatsu, Kanagawa-ken (JP); Reiji Ono, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/867,145

(22) PCT Filed: Feb. 10, 2009

(86) PCT No.: PCT/JP2009/000544
§ 371 (c)(1),
(2), (4) Date: Aug. 11, 2010

(87) PCT Pub. No.: WO2009/118985
PCT Pub. Date: Oct. 1, 2009

(65) Prior Publication Data
US 2011/0018026 A1 Jan. 27, 2011

(30) Foreign Application Priority Data

Mar. 25, 2008 (JP) ................................. 2008-077810
Oct. 24, 2008 (JP) ................................. 2008-274254
Dec. 8, 2008 (JP) ................................. 2008-312640

(51) Int. Cl.
*H01L 33/56* (2010.01)
(52) U.S. Cl. ......................................................... 438/15
(58) Field of Classification Search ............... 438/22–47
See application file for complete search history.

(56) References Cited

U.S. PATENT DOCUMENTS

| 3,875,456 | A | 4/1975 | Kano et al. |
| 6,417,019 | B1 | 7/2002 | Mueller et al. |
| 7,371,593 | B2 * | 5/2008 | Harada ........................... 438/26 |
| 7,531,845 | B2 * | 5/2009 | Oshio et al. .................... 257/98 |
| 2004/0012027 | A1 | 1/2004 | Keller et al. |
| 2004/0046178 | A1 | 3/2004 | Sano |
| 2005/0133808 | A1 | 6/2005 | Uraya et al. |

(Continued)

FOREIGN PATENT DOCUMENTS

EP 1367655 12/2003

(Continued)

OTHER PUBLICATIONS

International Search Report for PCT/JP2009/000544 mailed on Feb. 26, 2010.

(Continued)

*Primary Examiner* — Savitr Mulpuri
(74) *Attorney, Agent, or Firm* — Turocy & Watson, LLP

(57) ABSTRACT

A method for manufacturing a light emitting device includes: measuring at least one of each wavelength of the emitted light of the light emitting element, each optical output of the emitted light of the light emitting element, and each chromaticity of the mixed light emitted through the mixed resin in a manufacturing process of the light emitting device; and adjusting chromaticity for each light emitting device by performing a prescribed chromaticity adjustment with regard to the mixed resin, on basis of a result obtained in the measuring, so that the chromaticity of the mixed light falls within a preset prescribed range.

8 Claims, 14 Drawing Sheets

U.S. PATENT DOCUMENTS

| | | |
|---|---|---|
| 2006/0071591 A1 | 4/2006 | Takezawa et al. |
| 2006/0181192 A1* | 8/2006 | Radkov et al. ................ 313/486 |
| 2008/0224608 A1 | 9/2008 | Konishi et al. |
| 2009/0173957 A1* | 7/2009 | Brunner et al. ................ 257/98 |

FOREIGN PATENT DOCUMENTS

| | | |
|---|---|---|
| EP | 1403936 | 3/2004 |
| EP | 1811581 | 7/2007 |
| JP | 2004-186488 | 7/2004 |
| JP | 2005-333069 | 12/2005 |
| JP | 2006-303303 | 11/2006 |
| JP | 2007-066969 | 3/2007 |
| JP | 2007-317690 | 12/2007 |
| JP | 2009-130301 | 6/2009 |
| JP | 2009-193994 | 8/2009 |
| JP | 2009-193995 | 8/2009 |
| KR | 10-2007-0077777 | 7/2007 |
| WO | 0124229 | 4/2001 |
| WO | 2006/121197 A1 | 11/2006 |
| WO | 2007120582 | 10/2007 |

OTHER PUBLICATIONS

Written Opinion for PCT/JP2009/000544 mailed on Feb. 26, 2010.
International Preliminary Report on Patentability Issued on Sep. 28, 2010 for International Patent Application No. PCT/JP2009/000544 filed on Feb. 10, 2009.
Japanese Office Action for Japanese Application No. 2008-312640 mailed on Feb. 2, 2012.
European Office Action for European Application No. 09 723 886.9-2222 dated Dec. 12, 2011.
Korean Office Action for Korean Application No. 10-2010-7018221 issued on Dec. 21, 2011.

* cited by examiner

ND METHOD
LIGHT EMITTING DEVICE, AND METHOD AND APPARATUS FOR MANUFACTURING SAME

TECHNICAL FIELD

This invention relates to a light emitting device, and a method and an apparatus for manufacturing the same.

BACKGROUND ART

Emitted light from a light emitting element, such as a nitride light emitting element, and wavelength-converted light emitted from phosphor particles excited by absorbing the emitted light can be suitably mixed to obtain white light, incandescent light and the like. Such a light emitting device has advantages such as small size, light weight, low power consumption, and long lifetime, over light bulbs and fluorescent lamps, and hence has been put into widespread use in applications such as display devices, backlight sources for liquid crystal screens, and indoor lighting devices.

A light emitting element includes a light emitting layer made of a thin-film laminated body of compound semiconductor, for example, and has a distribution (variation) in peak wavelength, optical output and the like. Furthermore, phosphors made of fine particles exhibit a distribution in emission spectrum due to variations in, for example, particle diameter, composition, thickness of the coating layer, and mixing ratio with respect to liquid resin serving as solvent. Hence, the mixed color of emitted light and wavelength-converted light exhibits a chromaticity distribution. On the other hand, the light emitting device for the above applications is required to emit high-quality light with reduced chromaticity distribution.

JP-A-2007-066969 discloses a technique related to a white light emitting diode device with reduced chromaticity variation in the light emitting section and a method for manufacturing the same. The white light emitting diode device of this technique has a phosphor layer including phosphor particles and a transparent resin with its application thickness configured in accordance with the peak wavelength of the light emitting diode chip.

However, even this technique is not sufficient to reduce the chromaticity distribution caused by the thickness distribution of the applied phosphor layer.

Patent Citation 1: JP-A-2007-066969

DISCLOSURE OF INVENTION

Technical Problem

This invention provides a light emitting device, and a method and an apparatus for manufacturing the same, in which the applied amount of phosphor particles is controlled and a mixed color with reduced chromaticity variation is able to be emitted.

Technical Solution

According to an aspect of the invention, there is provided a method for manufacturing a light emitting device including a light emitting element and a mixed resin mixed with phosphor particles capable of absorbing an emitted light from the light emitting element and emitting wavelength-converted light, the light emitting device being operable to emit mixed light including the emitted light and the wavelength-converted light, the method comprising: measuring at least one of each wavelength of the emitted light of the light emitting element, each optical output of the emitted light of the light emitting element, and each chromaticity of the mixed light emitted through the mixed resin in a manufacturing process of the light emitting device; and adjusting chromaticity for each light emitting device by performing a prescribed chromaticity adjustment with regard to the mixed resin, on basis of a result obtained in the measuring, so that the chromaticity of the mixed light falls within a preset prescribed range.

According to another aspect of the invention, there is provided a light emitting device including: a light emitting element; a first sealing layer made of a resin dispersed with phosphor particles absorbing emitted light from the light emitting element and emitting wavelength-converted light having a longer wavelength than the emitted light, the first sealing layer covering at least an upper surface of the light emitting element; and a second sealing layer made of a resin dispersed with the phosphor particles, the second sealing layer covering an upper surface of the first sealing layer, the light emitting device being operable to emit mixed light of the emitted light and the wavelength-converted light.

According to still another aspect of the invention, there is provided an apparatus for manufacturing a light emitting device, including: a detection unit operable to measure chromaticity of a light emitting element bonded to a mounting member; a supply unit operable to drop a mixed resin mixed with phosphor particles on the light emitting element; and a control unit operable to receive as input the chromaticity measured by the detection unit and stop dropping the mixed resin upon determination that the chromaticity falls within a prescribed range.

Figure 1A:
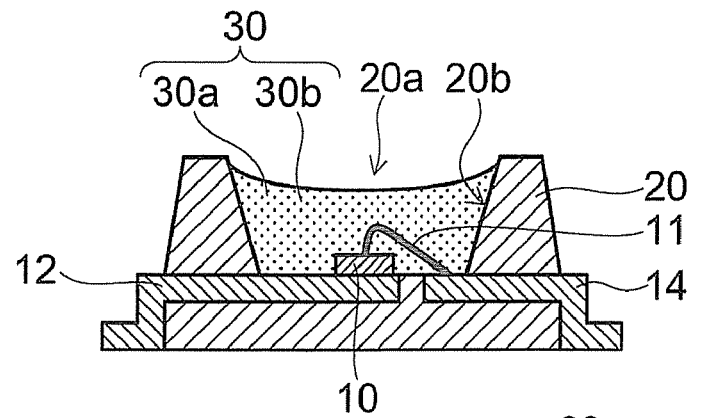
FIGS. 1A to 1C are schematic views of a light emitting device and a method for manufacturing the same according to a first embodiment of the invention.

EXPLANATION OF REFERENCE 10 light emitting device
20 molded body
20a recess
30, 32, 34 first mixed resin
30a phosphor particle
30b, 42 translucent resin
31, 33, 35 first sealing layer
40 second mixed resin
40b second translucent resin
41, 43, 45 second sealing layer
46 scattering particle
50 ink jet device
50a nozzle
84 control unit
G mixed light
B chromaticity coordinate of emitted light
Y chromaticity coordinate of wavelength-converted light
Q1 chromaticity coordinate after application of the first mixed resin
QW prescribed chromaticity coordinate
$a_i$ phosphor compounding ratio
b required weight of phosphor particle

BEST MODE FOR CARRYING OUT THE INVENTION

Embodiments of the invention will now be described with reference to the drawings.

Figure 1B:
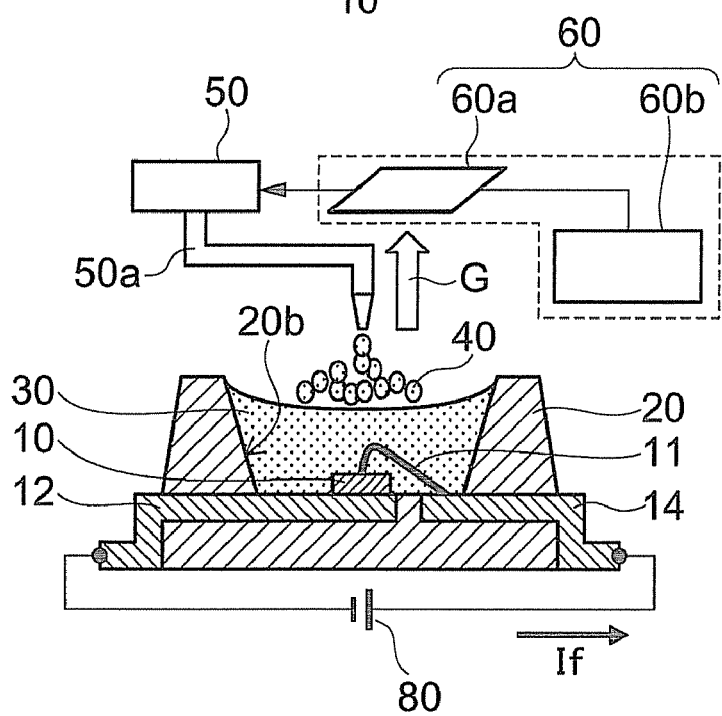
Figure 1C:
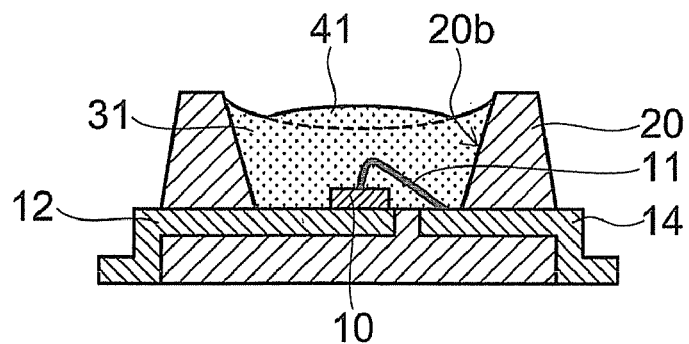

FIG. 1 is a schematic view illustrating a light emitting device and a method for manufacturing the same according to a first embodiment of the invention. More specifically, FIG. 1A is a schematic cross-sectional view after the process of applying a first mixed resin, FIG. 1B shows a process of overlay coating of a second mixed resin, and FIG. 1C is a schematic cross-sectional view of the light emitting device after the process of applying the second mixed resin.

In the light emitting device shown in FIG. 1A, a first lead 12 and a second lead 14 made of a metal are embedded in a molded body 20 illustratively made of a thermoplastic or thermoset resin. This molded body 20 has a recess 20a, and the first and second lead 12, 14 are each partly exposed to the bottom of the recess 20a. A light emitting element 10 is bonded to the first lead 12 partly exposed to the bottom. One electrode of the light emitting element 10 is electrically connected to the portion of the second lead 14 exposed to the bottom through a bonding wire 11.

The molded body 20 can be illustratively made of a polyphthalamide thermoplastic resin material having high heat resistance. In this case, if a reflective filler is mixed into the resin material, light can be reflected at the surface thereof, and the inner sidewall 20b of the recess 20a can easily serve as a light reflector.

As in FIG. 1A, in the recess 20a, a first mixed resin 30 is applied to cover at least the surface of the light emitting element 10 and the bonding wire 11. The first mixed resin 30 is produced by mixing phosphor particles 30a and a liquid translucent resin 30b. In this example, the light emitting element 10 is made of a nitride semiconductor and emits blue light in the wavelength range of 455-465 nm. The translucent resin 30b can be illustratively made of silicone resin or epoxy resin. Silicone resin can prevent discoloration of the resin due to irradiation with ultraviolet to blue light.

In this example, the phosphor 30a is made of a silicate material that can be excited by absorbing blue light to emit wavelength-converted light in the wavelength range of 565-575 nm, for example. The silicate phosphor is illustratively expressed by a composition formula of $(Me_{1-y}Eu_y)_2SiO_4$ (where Me is at least one element selected from Ba, Sr, Ca, and Mg, $0<y<1$ or $Y=1$). White light can be obtained by mixing blue light and yellow light at a suitable light intensity ratio. In the state of FIG. 1A, the amount of the applied first mixed resin 30 is adjusted so that the mixed light G is closer to blue light rather than to white light.

Next, as in FIG. 1B, a second mixed resin 40 is produced by mixing the phosphor 30a and the liquid translucent resin 30b and stored in a container of an ink jet device 50. From a nozzle 50a of the ink jet device 50, the second mixed resin 40 is dropped as a small droplet to the surface of the light emitting element 10 coated with the first mixed resin 30, illustratively by discharging one shot by one shot. To drop a small droplet, a nozzle 50a having a discharge hole with an inner diameter of several ten micrometers, for example, is used. On the other hand, for the first mixed resin 30, a discharge hole having a larger diameter capable of dropping a large amount can be used for higher productivity.

At this time, the first and second lead 12, 14 are connected to a DC power supply 80 to supply a forward current If to each light emitting element 10 and cause the light emitting element 10 to emit light. As a result, the light emitting device emits mixed light G. This mixed light G is incident on a detection unit 60a of a spectral device 60, which outputs the chromaticity thereof to a display unit 60b. While the second mixed resin 40 in small droplets is successively dropped from the nozzle 50a, the change in each chromaticity associated therewith is measured (monitored) using the display unit 60b (a measuring process). The spectral device 60 can illustratively be a luminance measurement spectral device capable of measuring luminance, light flux, dominant wavelength, peak wavelength, chromaticity and the like. Instead of the spectral device 60, it is also possible to use a chromoscope capable of measuring chromaticity and luminance.

When the detection unit 60a detects that the chromaticity coordinates have reached a desired range or prescribed coordinate values, the spectral device 60 stops dropping the second mixed resin 40 (a chromaticity adjusting process). In this case, a detection signal can be transmitted from the spectral device 60 to the ink jet device 50 to provide automatic control to stop applying the second mixed resin 40.

Here, the second mixed resin 40 may be dropped after curing the first mixed resin 30, or before curing the first mixed resin 30. Alternatively, the second mixed resin 40 may be dropped during curing the first mixed resin 30.

FIG. 1C shows a cross section of the light emitting device in which the chromaticity coordinates have reached prescribed coordinates representing white light, for example, and the first and second mixed resin 30, 40 are heat cured. That is, the first mixed resin 30 is heat cured into a first sealing layer 31. The dropped second mixed resin 40 is heat cured into a second sealing layer 41 on the upper surface of the first sealing layer 31. Heat curing can be performed by heat treatment in the temperature range of 100-200 degrees centigrade, for example.

Depending on the time elapsed after application of the first mixed resin 30 and the presence or absence of the heat curing process, for example, the interface between the first sealing layer 31 and the second sealing layer 41 may be difficult to identify. However, even if generally identical materials are used, the interface therebetween can be often identified illustratively by analyzing the shape of the cross section, the precipitation state of the phosphor 30a in the first sealing layer 31, and the arrangement state of the translucent resin.

Here, the first mixed resin 30 and the second mixed resin 40 may be formed separately, or may be the same mixed resin formed simultaneously.

In the case of being separately formed, the viscosity of the second mixed resin 40 and the amount of the phosphor 30a contained therein can be illustratively adjusted to be different from those of the first mixed resin 30 so as to be easily discharged from the ink jet device 50. Furthermore, the particle diameter of the phosphor 30a mixed into the second mixed resin 40 can be illustratively made smaller than the particle diameter of the phosphor 30a mixed into the first mixed resin 30 in view of the opening diameter of the nozzle of the ink jet device 50. Moreover, the translucent resin 30b used for the first mixed resin 30 may be different from the translucent resin 30b used for the second mixed resin 40. For example, the translucent resin 30b used for the first mixed resin 30 can have such viscosity pr fluidity as to facilitate embedding around the light emitting element 10, whereas the translucent resin 30b used for the second mixed resin 40 can have such viscosity or fluidity as to facilitate discharging by the ink jet device.

The light emitting device shown in FIG. 1C is called a surface-mounted device (SMD), which can reduce the profile of display devices, backlight sources, lighting devices and the like.

Figure 2A:
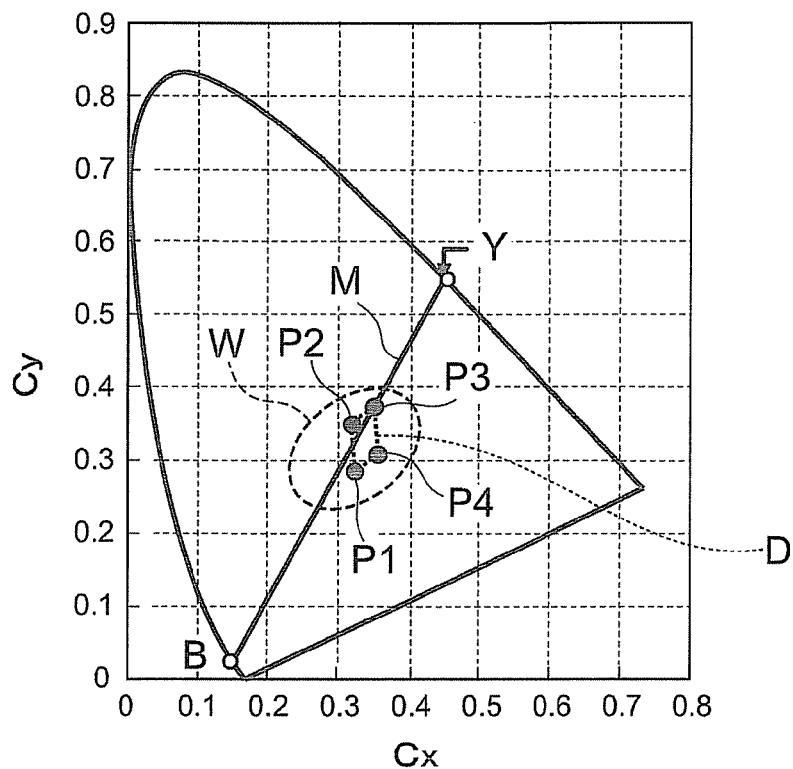
FIGS. 2A and 2B are chromaticity diagrams of a light emitting device according to a comparative example.
Figure 2B:
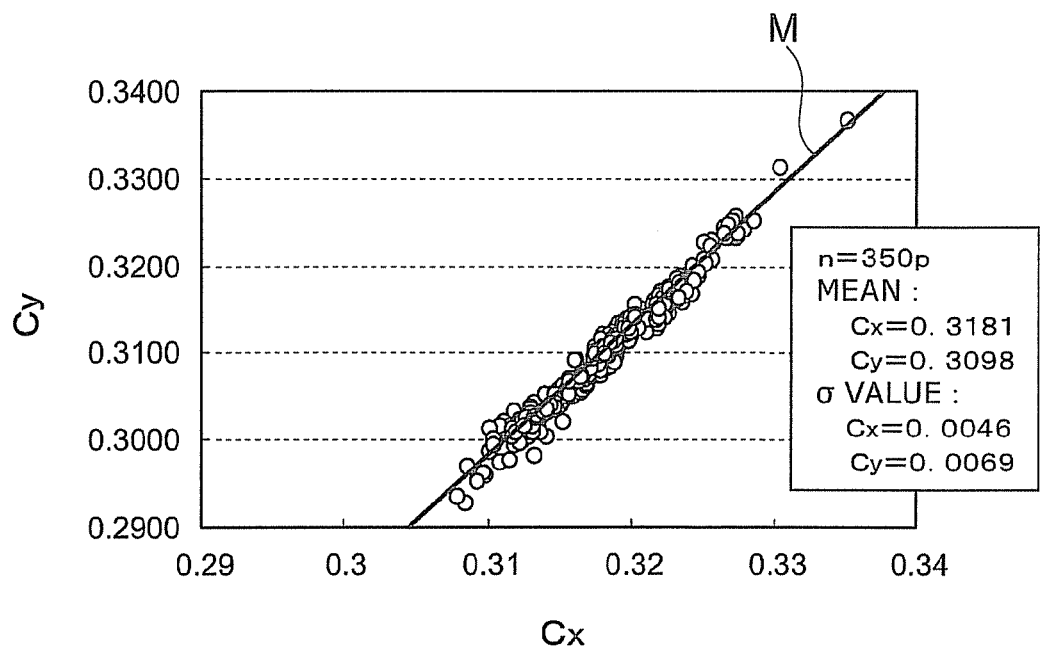

FIG. 2 is a chromaticity diagram illustrating the chromaticity of a light emitting device according to a comparative example. More specifically, FIG. 2A is a chromaticity diagram showing the range of white light, and FIG. 2B is an enlarged chromaticity diagram showing the chromaticity distribution of samples. This chromaticity diagram is based on the standards of CIE (Commission Internationale de l'Eclairage) and shows a relative luminous efficiency curve, where the horizontal and vertical axis represent chromaticity coordinates Cx and Cy, respectively.

As in FIG. 2A, blue light is illustratively in the wavelength range of 455-465 nm and represented by point B in the chromaticity diagram. On the other hand, the wavelength-converted light produced by yellow phosphor is illustratively in the wavelength range of 565-575 nm and represented by point Y in the chromaticity diagram. The mixed light G of the blue light and the yellow light moves, in accordance with the light intensity ratio therebetween, along line M connecting between point B and point Y.

In the comparative example, to realize mixed light in D region surrounded by points P1(0.3150, 0.290), P2(0.315, 0.350), P3(0.330, 0.370), P4(0.330, 0.305) in the white area W indicated by the dashed line, for example, a preset amount of mixed resin is applied at a time, and no overlay coating with chromaticity monitoring is performed. This causes, for example, variations in the amount of mixed resin applied to the light emitting element in the recess and variations in the precipitation rate of phosphor particles. Thus, the mixed light has a large chromaticity variation.

FIG. 2B shows the chromaticity distribution obtained by measuring the chromaticity of 350 light emitting devices according to the comparative example. The chromaticity variation is large as shown. If the chromaticity distribution is regarded as a normal distribution, the mean values were Cx=0.3181, Cy=0.3098, and the standard deviation $sigma_1$ was 0.0046 for Cx and 0.0069 for Cy. The chromaticity range of (mean plus or minus 3 $sigma_1$) was 0.3043-0.3319 for Cx and 0.2891-0.3305 for Cy. Hence, the tail of the chromaticity distribution extends out of the D region of FIG. 2A. Thus, the chromaticity has large nonuniformity, and the manufacturing yield decreases.

Figure 3A:
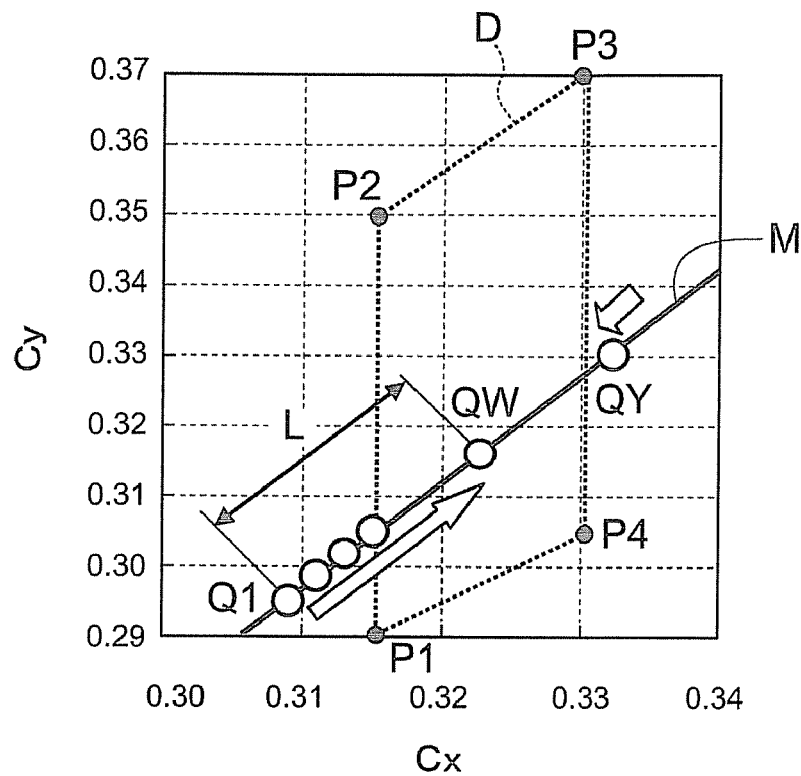
FIGS. 3A and 3B are chromaticity diagrams of the light emitting device according to the first embodiment.
Figure 3B:
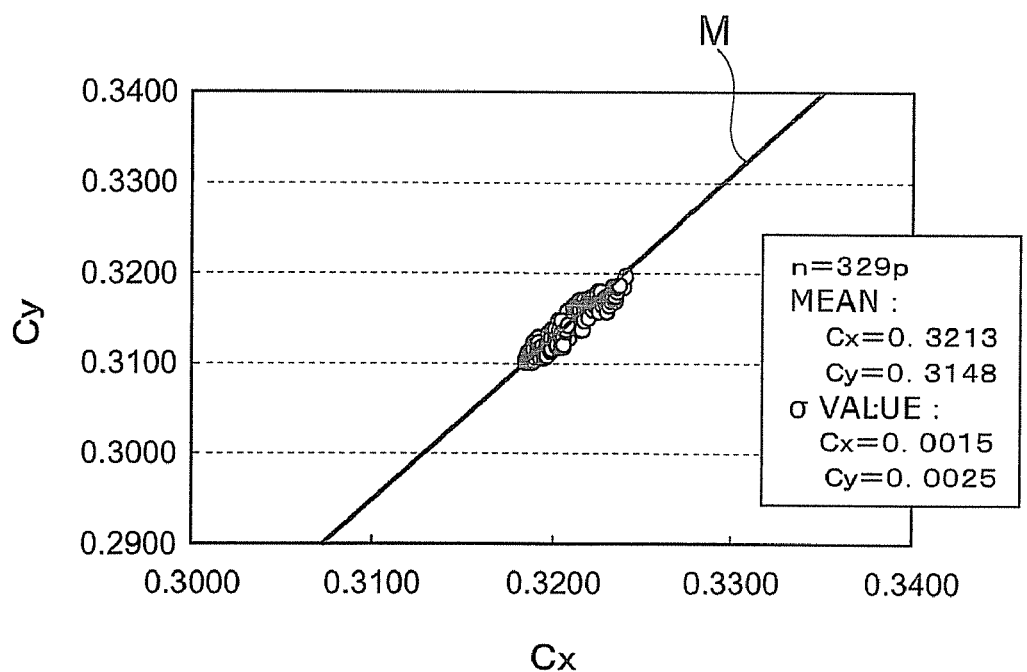

FIG. 3 is a chromaticity diagram illustrating the chromaticity of the light emitting device according to this embodiment. More specifically, FIG. 3A illustrates the function of overlay coating of this embodiment, and FIG. 3B is an enlarged chromaticity diagram showing the chromaticity distribution of samples.

FIG. 3A shows the D region of FIG. 2A, which is a desired region of white light. That is, the D region is a region surrounded by four points P1, P2, P3, P4. The target having prescribed chromaticity coordinates is set to point QW(0.322, 0.317) in this D region. This point QW is on line M connecting between point B and point Y in FIG. 2A.

The light emitting device coated with the first mixed resin 30 has a chromaticity distribution, and point Q1 corresponds to the mean value of the distribution. This point Q1 is set on line M between point QW and point B. With the variation in the amount of the first mixed resin 30, the amount of phosphor particles 30a varies, and the chromaticity coordinates may lie off the desired region, i.e., D region. In this case, overlay coating with chromaticity monitoring can be performed until the chromaticity coordinates enter the D region. Then, the chromaticity can be confined within the desired D region, and the chromaticity distribution can be reduced.

The chromaticity distribution can be further reduced by suitably setting the coordinates of point Q1. It is considered that the chromaticity distribution of the first mixed resin 30 has a standard deviation $sigma_1$ generally equal to that of the comparative example. If the coordinate distance L between point Q1 and point QW representing the prescribed chromaticity coordinates is set shorter than 3 $sigma_1$, the chromaticity distribution can be further reduced, because in the distribution region located on the point B side of point QW, the second mixed resin 40 is overlaid until the chromaticity comes near point QW.

On the other hand, if the coordinate distance L is set to 3 $sigma_1$ or more, the proportion of samples located on the point Y side of point QW is as low as generally 0.26% or less, and the chromaticity distribution can be regarded as a nearly normal distribution with the mean value located near point QW and the standard deviation $sigma_2$ further reduced. However, if the coordinate distance L is too long, the amount of the second mixed resin 40 dropped to bring the chromaticity from point Q1 close to point QW increases, and the productivity decreases. Hence, the standard deviation $sigma_1$ of the chromaticity distribution in the comparative example is determined previously, and the first mixed resin 30 is applied so that the coordinate distance L is equal to generally 3 $sigma_1$. Then, in a proportion of generally 99.7% of the samples, the chromaticity can be controlled within the neighborhood of point QW by overlay coating.

That is, in FIG. 3A, if small droplets of the second mixed resin 40 are dropped from the nozzle 50a, the chromaticity coordinates move along line M toward point Y in the direction of the arrow. The chromaticity coordinates are constantly monitored by the spectral device 60. Thus, when the chromaticity coordinate values become the values of point QW or more, the dropping of the second mixed resin 40 is stopped. Even if the amount of phosphor particles 30a contained in the first mixed resin 30 varies, the amount of phosphor particles contained in the second mixed resin 40 can be suitably controlled while directly monitoring the chromaticity coordinates.

It is noted that the mixing ratio of the phosphor particles 30a in the first mixed resin 30 and the mixing ratio of the phosphor particles 30a in the second mixed resin 40 may be equal or different. In the case of yellow phosphors, the content of phosphor particles 30a can be selected in a wide range from several to 50 weight % of the mixed resin. In the case where the chromaticity of the desired region has a wide range, the mixing ratio of the phosphor particles 30a can be increased to bring the chromaticity close to point QW with a smaller number of droplets. In the case where the chromaticity has a narrow range, the mixing ratio of the phosphor particles 30a can be decreased to facilitate further reducing the amount of variation in one shot.

FIG. 3B shows the chromaticity distribution of 329 samples obtained by the manufacturing method of this embodiment. The mean values were Cx=0.3213, Cy=0.3148, and the standard deviation $sigma_2$ was 0.0015 for Cx and 0.0025 for Cy, which were reduced to approximately ⅓ of those of the comparative example. The range of (mean plus or minus 3 $sigma_2$) was 0.3168-0.3258 for Cx and 0.3073-0.3223 for Cy, containing a proportion of 99.7% or more of the samples. Thus, in this embodiment, the applied amount of phosphor particles is controlled so as to reduce the chromaticity variation and facilitate confining the chromaticity distribution within the desired D region surrounded by four points P1-P4. Hence, this embodiment can provide a light emitting device capable of emitting a mixed color with reduced chromaticity variation.

Furthermore, the distribution on the order of $sigma_2$, which is caused illustratively by variations in the particle diameter, precipitation state, and composition of the phosphor, the wavelength distribution of the light emitting element, and the heat treatment condition, is as low as approximately ⅓ of that of the comparative example. Thus, this embodiment provides a method for manufacturing a light emitting device with improved yield and high volume productivity.

Figure 4A:
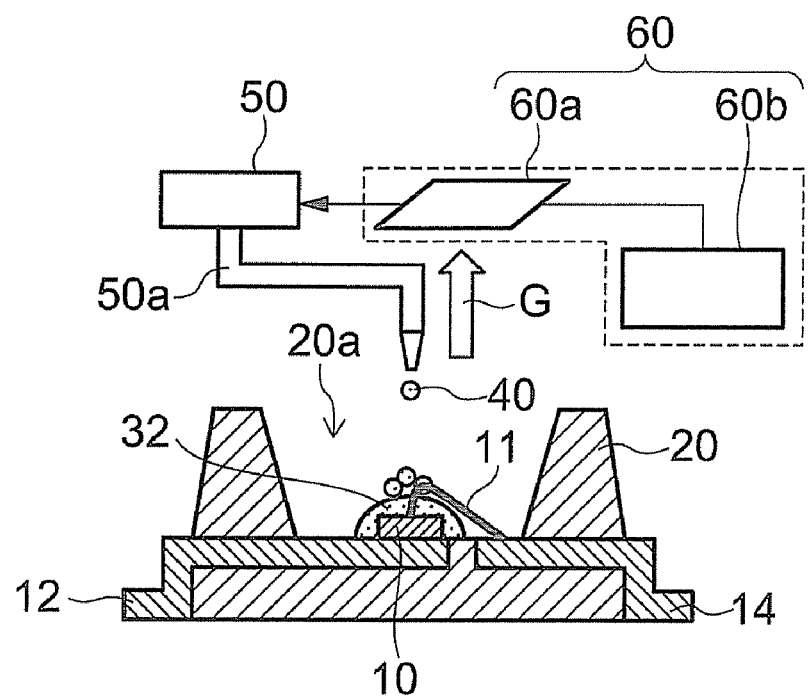
FIGS. 4A and 4B are schematic views of a light emitting device according to a second embodiment.
Figure 4B:
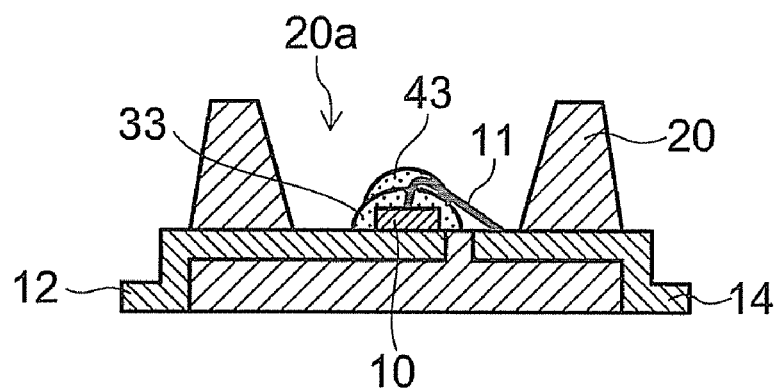

FIG. 4 is a schematic view of a light emitting device according to a second embodiment. More specifically, FIG. 4A shows the process of applying a second mixed resin, and FIG. 4B is a cross-sectional view of the light emitting device after the process of applying.

In the recess 20a of the molded body 20, a first mixed resin 32 is applied by a printing process using an ink jet device 50, for example, so that the first mixed resin 32 fills a portion in the recess 20a including at least the surface of the light emitting element 10 and does not fill the remaining space. Consequently, as in FIG. 4A, the first mixed resin 32 is shaped like a dome.

Furthermore, simultaneously with chromaticity monitoring, small droplets of the second mixed resin 40 are dropped from above the light emitting element 10 coated with the first mixed resin 32. When the chromaticity reaches the prescribed chromaticity coordinates of point QW or more, the dropping is stopped. By using a nozzle 50a having a small inner diameter, it is easy to accurately drop the second mixed resin 40 from above the light emitting element 10 coated with the first mixed resin 32. This results in a dome-shaped structure as in FIG. 4B, where a first sealing layer 33 is overlaid by a second sealing layer 43.

In the light emitting device manufactured by the process like this, phosphor particles are not placed near the inner sidewall 20b of the recess 20a that reflects light. This serves to reduce the difference between the optical length of the emitted light of the light emitting element 10 and the optical length of the wavelength-converted light, and prevent the neighborhood of the inner sidewall 20b from having a tinge of yellow.

Figure 5A:
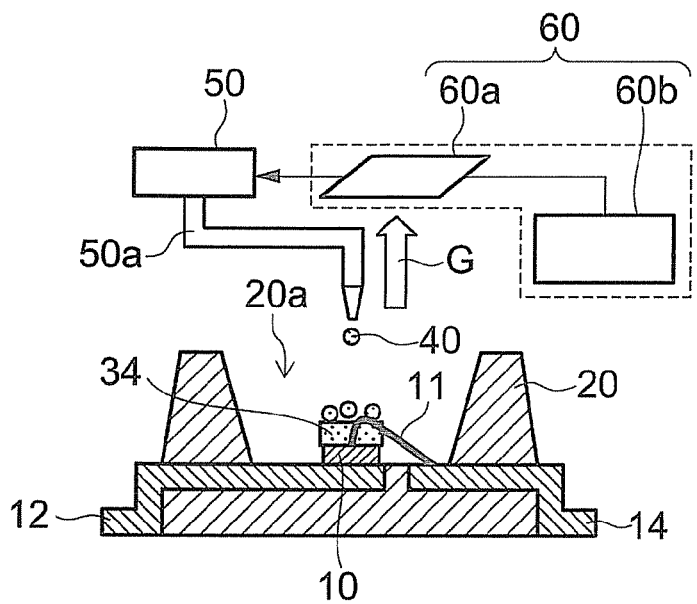
FIGS. 5A and 5B are schematic views of a light emitting device according to a third embodiment.
Figure 5B:
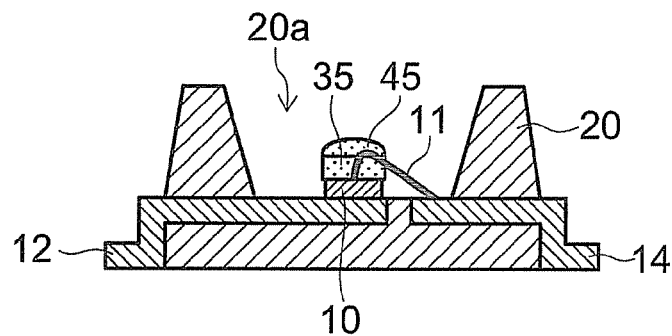

FIG. 5 is a schematic view of a light emitting device according to a third embodiment. More specifically, FIG. 5A shows the process of applying a second mixed resin, and FIG. 5B is a cross-sectional view of the light emitting device after the process of applying.

The first mixed resin 34 is applied to the upper surface of the light emitting element 10 in the wafer state. Subsequently, it is divided into chips by dicing or cleavage. The chip is bonded to the first lead 12, which is exposed to the bottom of the recess 20a formed in the molded body 20. Then, simultaneously with chromaticity monitoring, small droplets of the second mixed resin 40 are dropped from above the light emitting element 10 coated with the first mixed resin 35. When the chromaticity reaches the prescribed chromaticity coordinates or more, the dropping is stopped. This results in a structure as in FIG. 5B, where a first sealing layer 35 on the chip is overlaid by a second sealing layer 45.

By using the manufacturing method shown in FIG. 5, phosphor particles 30a can be placed only on the upper surface of the chip of the light emitting element 10. This serves to further align the emission directions of the blue light and the wavelength-converted light, and further facilitate preventing the neighborhood of the inner sidewall 20b from having a tinge of yellow. However, the process of applying phosphor particles 30a onto the wafer is needed.

Figure 6:
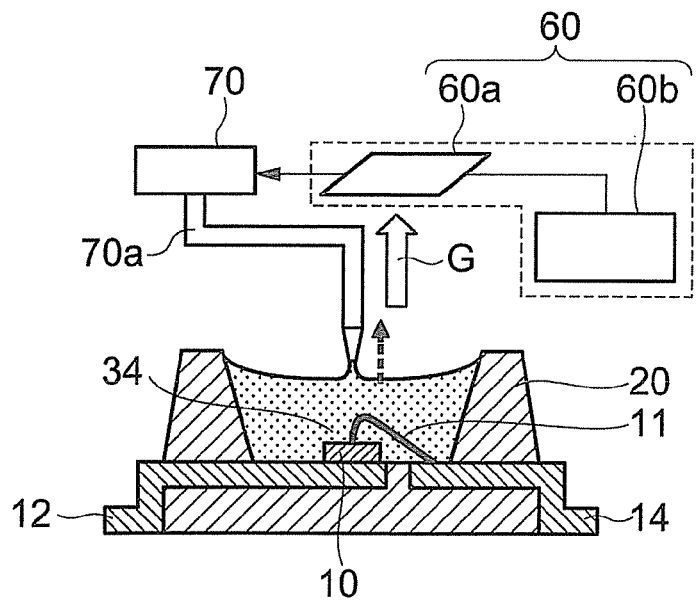
FIG. 6 is a schematic view of a light emitting device according to a fourth embodiment.

FIG. 6 is a schematic view of a light emitting device according to a fourth embodiment. Point QY, which represents the coordinate values of the mean of the chromaticity distribution after application of the first mixed resin 30, is set on the point Y side of point QW having the prescribed chromaticity coordinates. The first mixed resin 30 in excess is gradually removed as indicated by the dashed arrow through a suction nozzle 70a provided in a suction device 70. If the chromaticity lies off the desired D region on the point Y side, suction is performed with chromaticity monitoring until the chromaticity enters the D region (the adjusting process). Consequently, the chromaticity distribution can be reduced.

If the suction is stopped when the chromaticity coordinates reach the prescribed coordinate values of point QW or less, the chromaticity distribution can be reduced to a narrower range. For example, the coordinate distance between point QW and point QY is set to 3 $sigma_1$ of the comparative example or more, and the suction is stopped at the chromaticity coordinate values of point QW or less. Then, the chromaticity distribution can be regarded as a nearly normal distribution with the mean value located near point QW and a reduced standard deviation. In this embodiment, the chromaticity distribution can be reduced even in one step of application.

In FIGS. 4 to 6, the light emitting element 10 has electrodes above and below the chip. However, the invention is not limited to this structure. The chip may have two electrodes on one side thereof and bonded to a mounting member via a submount material using a flip chip structure.

In the light emitting device described with reference to the chromaticity diagram of FIG. 3, the phosphor particle is made of a yellow phosphor. However, the invention is not limited thereto. For example, it is possible to use three-color mixing based on blue light represented by point B, yellow light represented by point Y, and orange light. Alternatively, the emitted light of the light emitting element 10 may have a wavelength range from ultraviolet to blue light, and it is possible to use three-color mixing based on R (red light), G (green light), and B (blue light) emitted from YAG (yttrium-aluminum-garnet) phosphors.

Figure 7A:
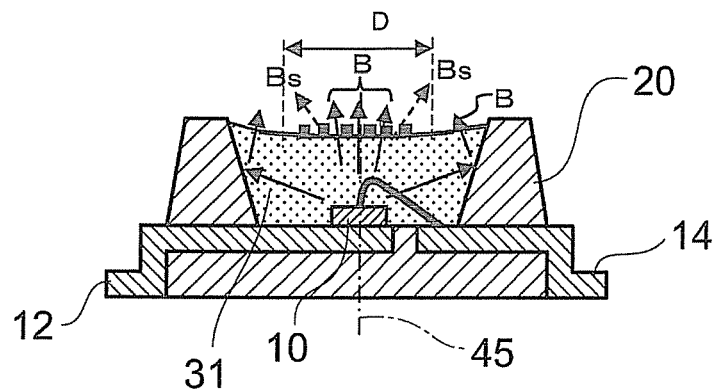
FIGS. 7A to 7C are schematic views of a light emitting device according to a fifth embodiment.
Figure 7B:
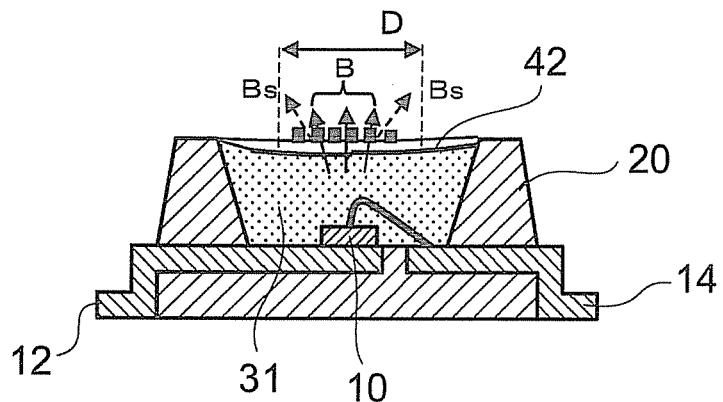
Figure 7C:
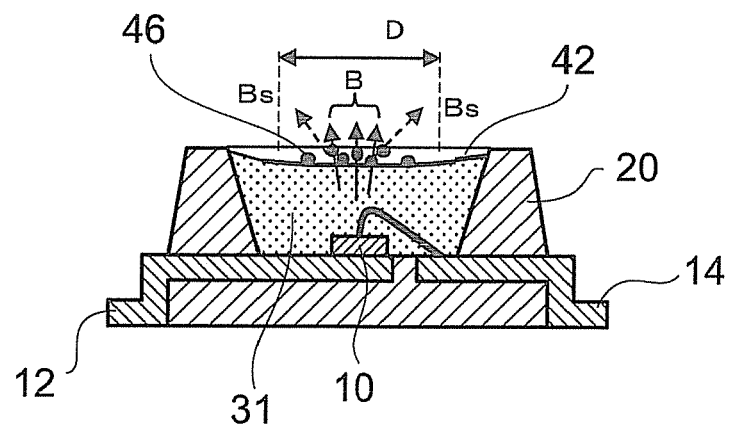

FIG. 7 is a schematic view of a light emitting device according to a fifth embodiment. More specifically, FIG. 7A shows a surface-modified light emitting device, FIG. 7B shows a light emitting device including a surface-modified translucent resin without phosphor particles mixed therein, and FIG. 7C shows a light emitting device including a mixed resin on which scattering particles are mixed.

In FIG. 7A, blue light B from the light emitting element 10 has a maximum intensity near the optical axis 45 generally perpendicular to the surface of the light emitting element 10. Above the light emitting element 10, the first sealing layer 31 made of a mixed resin is thinner than at the periphery. Hence, blue light B absorbed in phosphor particles decreases, and the intensity of blue light B tends to increase. On the other hand, the phosphor particles are dispersed in the recess 20a. Hence, yellow light, rather than blue light, is emitted more uniformly above the recess 20a.

In this embodiment, after the first mixed resin 30 is cured, its surface is roughened by irradiation with a plasma or ozone to form a scattering region D. The filled squares represent surface irregularities caused by roughening. Part of the blue light B is scattered into scattered light Bs. Hence, the blue light B is weakened at the center. The chromaticity can be adjusted by varying the degree of scattering on the basis of the width or irregularity configuration of the scattering region D (the adjusting process).

Alternatively, as in FIG. 7B, a translucent resin 42 without phosphor particles mixed therein is applied onto the first sealing layer 31, and its surface may be roughened by irradiation with a plasma or ozone to form a scattering region D. Also in this case, part of the blue light B is scattered into scattered light Bs, which allows chromaticity adjustment of the emitted light. In this case, surface modification is easier because no phosphor particles are mixed in the translucent resin 42.

Further alternatively, as in FIG. 7C, a liquid translucent resin 42 without phosphor particles mixed therein is applied onto the first sealing layer 31, and scattering particles 46 illustratively made of $SiO_2$ or $TiO_2$ may be mixed therein before complete curing to form a scattering region D (the adjusting process). Also in this case, part of the blue light B can be turned into scattered light Bs, which allows chromaticity adjustment. Here, the scattering particles 46 may be mixed before complete curing of the first mixed resin 30. However, by using the translucent resin 42 without phosphor particles mixed therein as in FIG. 7C, the amount of scattering particles 46 can be increased, which facilitates varying the scattering direction more greatly. In this embodiment, the scattering region D serves to vary the degree of scattering so that the chromaticity of the mixed color is brought close to a prescribed chromaticity. Hence, the amount of phosphors contained in the applied first mixed resin 30 is controlled so that the chromaticity is lower than the chromaticity of point QW.

Figure 8:
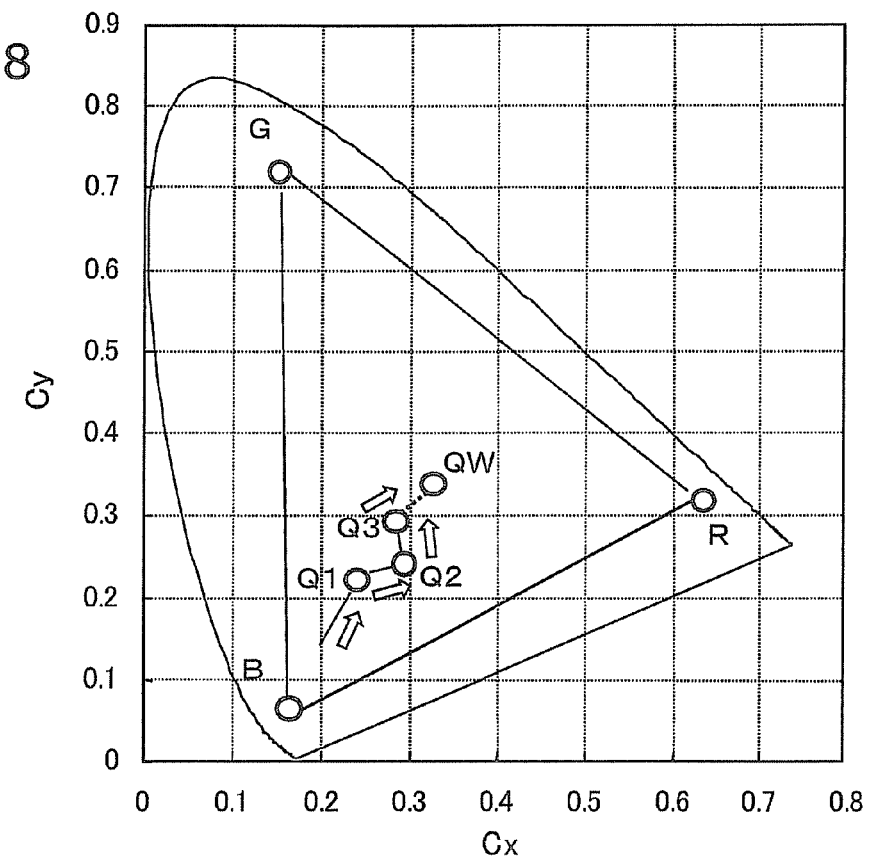
FIG. 8 is a chromaticity diagram of the light emitting device according to a sixth embodiment.

FIG. 8 is a chromaticity diagram illustrating a light emitting device according to a sixth embodiment.

In the light emitting device described with reference to the chromaticity diagram of FIG. 3, the phosphor particle is made of a yellow phosphor. However, the invention is not limited thereto. For example, it is possible to use three-color mixing based on blue light represented by point B, yellow light represented by point Y, and orange light. Alternatively, the emitted light of the light emitting element 10 may have a wavelength range from ultraviolet to blue light, and it is possible to use three-color mixing based on G (green light) emitted from a YAG (yttrium-aluminum-garnet) phosphor, R (red light) emitted from an oxide phosphor or the like, and B (blue light) emitted from the light emitting element.

Green light G from a green phosphor, red light R from a red phosphor, and blue light B, which is the emitted light from the light emitting element 10, are combined into a mixed color. Point QW is set in a prescribed target chromaticity range, which can illustratively represent white light or incandescent light.

Figure 9:
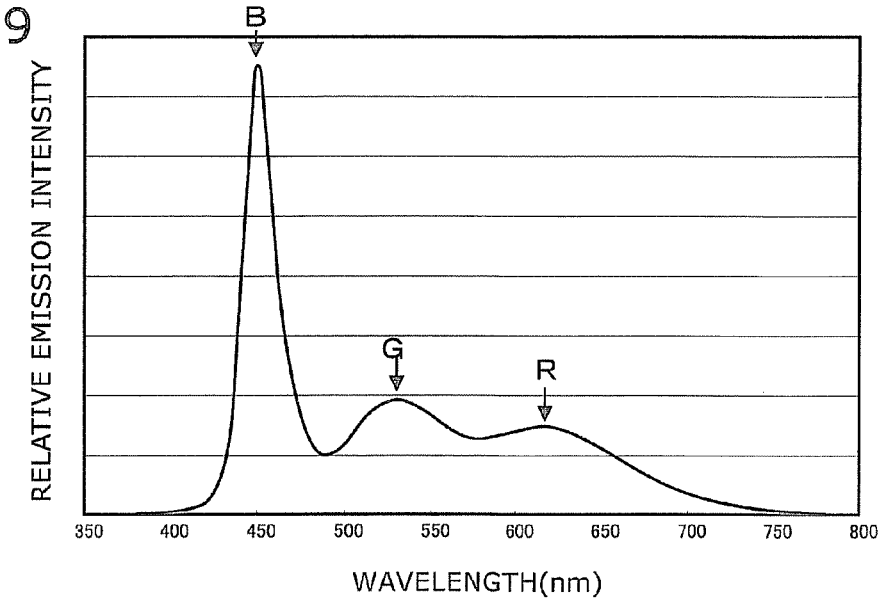
FIG. 9 is a view showing an emission spectrum of the light emitting device according to the sixth embodiment.

FIG. 9 shows the relative emission intensity of an emission spectrum of the light emitting device including a first sealing layer 31 in which green phosphor particles and red phosphor particles are mixed. The relative emission intensity of blue light B, green light G, and red light R is maximized at a wavelength near 455 nm, near 525 nm, and near 620 nm, respectively. The mixing ratio between green phosphor and red phosphor can be adapted to the center value of the characteristic distribution of the light emitting element 10 so that the mixed color achieves the prescribed chromaticity QW.

The second mixed resin (solution) 40 is made of a liquid translucent resin mixed with green phosphor and red phosphor, which are dropped from separate nozzles. The second mixed resin 40 mixed after dropping is cured into a second sealing layer 41 stacked on the first sealing layer 31.

The measured chromaticity represented by point Q1 is compared with the prescribed chromaticity represented by point QW. If the relative intensity of red light R is insufficient, the second mixed resin 40 is dropped at an increased ratio of the red phosphor. Subsequently, the chromaticity of point Q2 is measured. If the relative intensity of green light G is insufficient, the second mixed resin 40 is dropped at an increased ratio of the green phosphor. Thus, the chromaticity is measured for each shot of the second mixed resin 40, which is dropped until the prescribed chromaticity of point QW is achieved.

Alternatively, the second mixed resin 40 having a definite mixing ration of green phosphor and red phosphor may be dropped from one nozzle, and furthermore, the shot may be continuous. Thus, the second mixed resin 40 is dropped until the prescribed chromaticity is achieved. In this case, the application process can be simplified, and the productivity can be easily increased.

Figure 10:
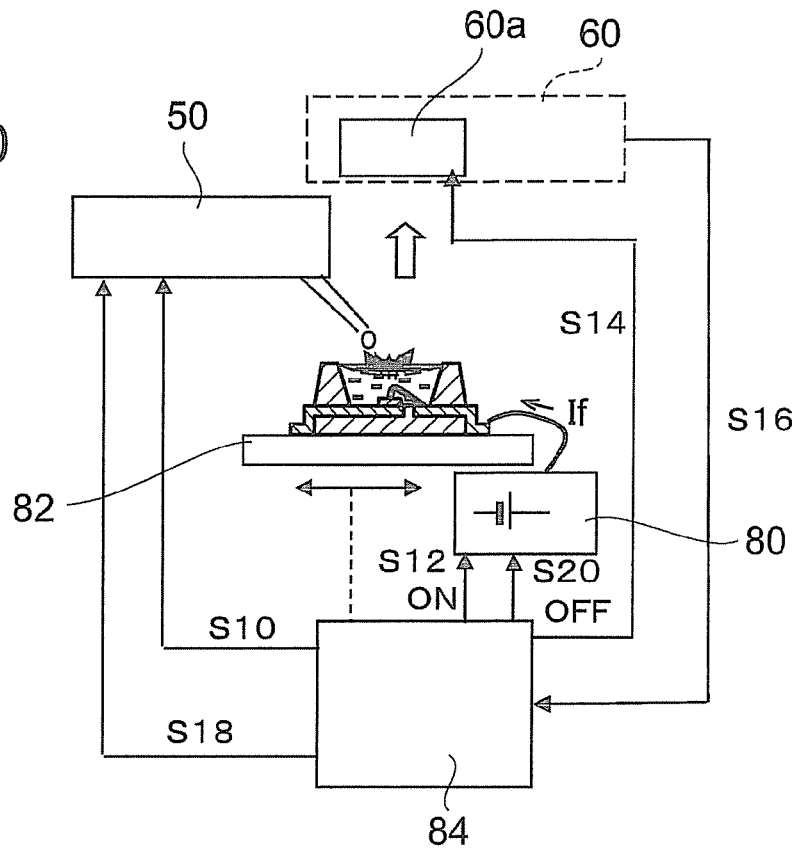
FIG. 10 is a configuration view of a manufacturing apparatus.

FIG. 10 is a configuration view of an apparatus for manufacturing a light emitting device.

This manufacturing apparatus includes a supply unit such as an ink jet device 50 or a dispenser, a spectral device 60 including a detection unit 60a, a DC power supply 80 capable of supplying a current If to the light emitting device, and a control unit 84.

First, the control unit 84 outputs a dropping start signal S10 to the supply unit, directing that the first mixed resin 30 mixed with phosphor particles is discharged from the nozzle so as to cover the surface of the light emitting element 10 bonded to the mounting member. Subsequently, the control unit 84 outputs an ON signal S12 to turn on the DC power supply 80 so that a forward current is supplied to the light emitting element 10.

The control unit 84 outputs a dropping start signal S10 to the supply unit. Thus, the supply unit discharges the second mixed resin 40 from the nozzle 50 to the surface of the first mixed resin 30. In response to the input of a chromaticity signal S16 detected by the detection unit 60a, when the control unit 84 determines that the chromaticity falls within the prescribed range, the control unit 84 outputs a dropping stop signal S18 for the second mixed resin 40 to the supply unit, and outputs an OFF signal S20 for the forward current If to the DC power supply. Thus, the application of the mixed resin 40 is ended. In the case where the scattering region is varied for chromaticity adjustment, a signal to stop forming the scattering region can be outputted. The manufacturing apparatus as described above facilitates producing a light emitting device with controlled chromaticity and high yield, and consequently enables cost reduction.

The first to fifth embodiment have a package structure in which metal leads are embedded in a resin or other molded body. However, the invention is not limited thereto. For example, it is also possible to use a dielectric substrate package illustratively made of ceramics or glass epoxy and having a conductive pattern.

Figure 11:
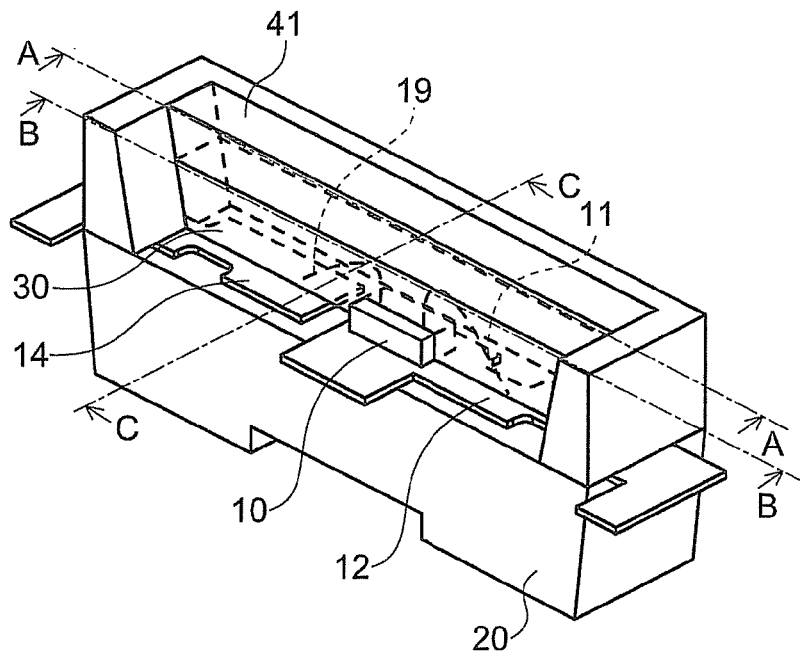
FIG. 11 is a schematic perspective view of a light emitting device according to a seventh embodiment.

FIG. 11 is a schematic perspective view of a light emitting device according to a seventh embodiment of the invention.

The light emitting device shown in FIG. 11 is of the laterally emitting (side-view) type. However, the invention is not limited thereto, but the light emitting device may be of the top-emitting type. In the perspective view of FIG. 11, to illustrate the chip neighborhood of the light emitting element 10, the first sealing layer 30 and the second sealing layer 40 are cut along line A-A, and the molded body 20 is cut along line B-B.

The first lead 12 is illustratively a cathode electrode, and then the second lead 14 is an anode electrode. The first and second lead 12, 14, which are embedded in a molded body 20 illustratively made of a thermoplastic resin, have inner lead portions opposed to each other inside the molded body 20 and outer lead portions protruding from the molded body 20 in opposite directions. The molded body 20 has a recess 20a. The first lead 12 is exposed to the bottom of the recess 20a, and a light emitting element 10 is bonded thereto using a silver paste, for example. The light emitting element 10 is connected to the first lead 12 through a bonding wire 11, and to the second lead 14 through a bonding wire 19.

The light emitting element 10 is covered with a first sealing layer 30 made of a first mixed resin in which a required weight of a first phosphor is mixed in a first translucent resin (having a refractive index n1 of generally 1.5). Part of the primary light emitted from the light emitting element 10 (i.e., emitted light) is absorbed in the phosphor mixed in the first translucent resin and converted to wavelength-converted light having a different wavelength. The first sealing layer 30 is covered with a second sealing layer 40 made of a second translucent resin (having a refractive index n2 of generally 1.4) without phosphor particles mixed therein. The first translucent resin and the second translucent resin can be illustratively made of silicone resin to prevent discoloration of the resin due to the primary light emitted from the light emitting element 10.

If the light emitting element 10 is made of a nitride semiconductor, white light or the like can be obtained as mixed light of blue light, which is the primary light emitted from the light emitting element 10, and the wavelength-converted light produced by yellow phosphor made of a silicate material, and can be used as a backlight source of a display device.

Figure 12:
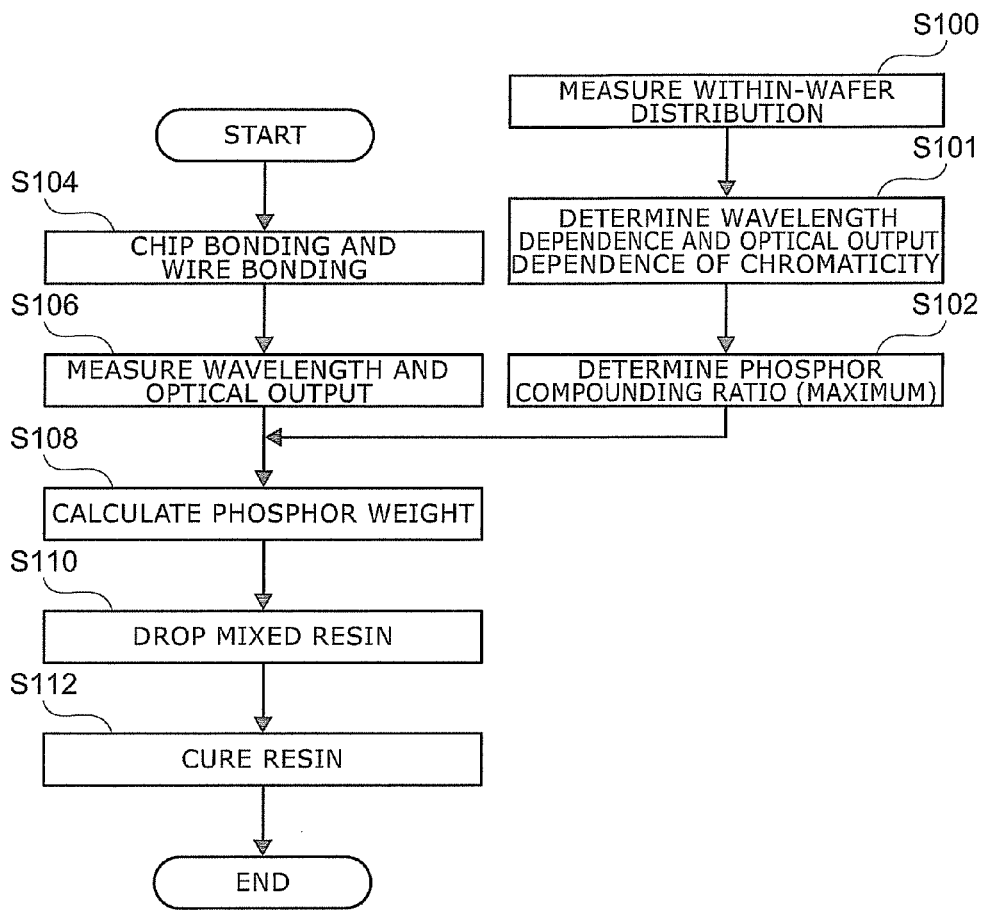
FIG. 12 is a flow chart of a method for manufacturing the light emitting device according to the seventh embodiment.

FIG. 12 is a flow chart illustrating a method for manufacturing the light emitting device according to the seventh embodiment.

The wavelength Ld, optical output Po and the like of the primary light emitted from the light emitting element 10 is distributed in the plane of the wafer. If the allowable distribution range of these characteristics is too narrow, the yield of conforming chips decreases. On the other hand, if the allowable distribution range is too wide, the chromaticity variation of the light emitting device increases, and the quality of optical characteristics decreases.

As a preliminary process, the within-wafer distribution of wavelength Ld and optical output Po of the primary light is measured (S100), and an allowable distribution range is suitably defined as, for example, Po (mW) is not smaller than 15 and not larger than 17 and Ld (nm) is not smaller than 450 and not larger than 460.

Subsequently, light emitting elements 10 in the defined allowable distribution range of wavelength Ld and optical output Po are extracted and used to assemble light emitting devices. These light emitting devices are prepared so that the chromaticity of the emitted mixed light has a prescribed chromaticity range of Cx being not smaller than 0.294 and not larger than 0.304, for example, and the chromaticity of the mixed light is measured by an optical characteristics measurement device 60 including a spectral device. Thus, the dependence of the chromaticity of the mixed light on the wavelength of the primary light (wavelength dependence) and that on the optical output of the primary light (optical output dependence) are determined (S101).

Figure 13A:
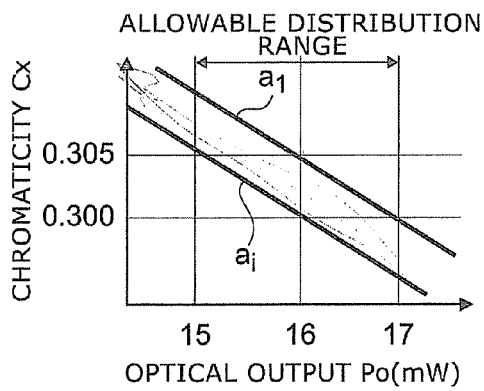
FIGS. 13A and 13B are graphs showing the chromaticity Cx.
Figure 13B:
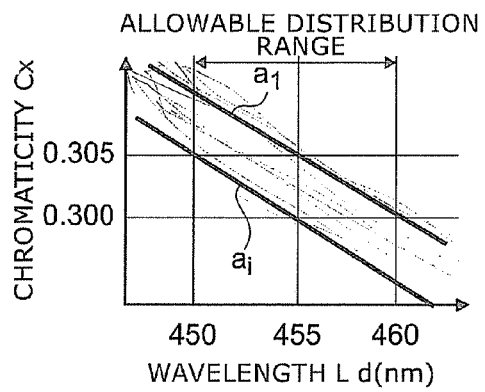

FIG. 13 is a graph showing the chromaticity Cx of the mixed light. More specifically, FIG. 13A shows the dependence of the chromaticity Cx of the mixed light emitted from the light emitting device on the optical output of the primary light, and FIG. 13B shows the dependence of the chromaticity Cx of the mixed light on the wavelength of the primary light. The vertical axis represents the chromaticity coordinate Cx of the chromaticity diagram, and the horizontal axis represents the optical output Po (mW) or wavelength Ld (nm) of the primary light emitted from the light emitting element.

FIG. 13A approximately shows the dependence of the chromaticity Cx of the mixed light on the optical output of the primary light in the case where the mixed resin liquid is filled in a constant volume with the phosphor compounding ratio, ai (i=1, . . . , N, N: integer) varied as a parameter while the wavelength Ld of the primary light is kept at the distribution upper limit, 460 nm. The phosphor compounding ratio ai is the ratio of the phosphor weight to the weight of the mixed resin liquid and expressed in weight % (wt %). The phosphor compounding ratio ai can illustratively be in the range of 5-50 wt %.

In the case where the phosphor compounding ratio ai is constant, the chromaticity Cx of the mixed light increases as the optical output Po of the primary light decreases. If the phosphor compounding ratio ai is decreased, the intensity of yellow light, which is the wavelength-converted light, decreases. Thus, the chromaticity Cx of the mixed light decreases and comes close to the blue light of the primary light. In general, the dependence of the chromaticity Cx of the mixed light on the optical output of the primary light cannot always be represented by a straight line. However, if the allowable distribution range of optical output Po of the primary light is limited to a narrow range of plus or minus 10% or less around its central value, the chromaticity Cx of the mixed light can be linearly approximated, and the method for calculating the phosphor weight is simplified. Furthermore, the linear approximation can reduce the number of light emitting devices assembled in the preliminary process. Here, the optical output dependence is determined also in the case where the wavelength Ld is set to a constant wavelength value that is shorter than the upper limit of the allowable distribution range, 460 nm.

On the other hand, FIG. 13B approximately shows the wavelength dependence of the chromaticity Cx of the mixed light in the case where the first mixed resin liquid is filled in a constant volume with the phosphor compounding ratio $a_i$ varied as a parameter while the optical output Po of the primary light is kept at the distribution upper limit, 17 mW. In the case where the phosphor compounding ratio ai is constant, the chromaticity Cx of the mixed light increases as the wavelength of the primary light decreases. If the phosphor compounding ratio ai is decreased, the intensity of yellow light, which is the wavelength-converted light, decreases, and the chromaticity Cx of the mixed light decreases. In general, the dependence of the chromaticity Cx of the mixed light on the wavelength of the primary light cannot also always be represented by a straight line. However, if the allowable distribution range of wavelength Ld is limited to a narrow range of plus or minus 1.5% or less around its central value, it can be linearly approximated, and the method for calculating the phosphor weight is simplified. Here, the wavelength dependence is determined also in the case where the optical output Po of the primary light is set to a constant wavelength value that is lower than the upper limit of the allowable distribution range, 17 mW.

If the wafer manufacturing process condition for the light emitting element 10 is accurately controlled, the wavelength dependence and the optical output dependence shown in FIG. 13 can be prevented from significantly varying between wafers, and these dependences are easily derived.

In the case where the chromaticity Cx of the mixed light has a prescribed range of 0.294-0.304, its target value can be illustratively set to 0.3. At Po=17 mW (optical power upper limit) and L=460 nm (wavelength upper limit) for the primary light, the phosphor compounding ratio a1 realizing Cx=0.3 can be determined illustratively by using FIG. 13 (S102). Thus, the preliminary process is completed.

Next, the process of assembling the light emitting device is performed.

FIG. 14 is a process cross-sectional view of resin sealing, showing the cross section taken along line C-C in FIG. 11.

The light emitting elements 10 are each bonded to a package and subjected to wire bonding (S104). Subsequently, as in FIG. 14A, the wavelength Ld and optical output Po of each light emitting element 10 are measured using the optical characteristics measurement device 60 (S106: the measuring process).

A description is given below of the process for calculating the required weight b of phosphor particles on the basis of the dependence of the chromaticity Cx of the mixed light on the wavelength of the primary light (FIG. 13A) and the dependence on the optical output (FIG. 13B), which are determined previously in the preliminary process, and the measurement values of the wavelength and optical output of the primary light of the light emitting elements 10.

Figure 15A:
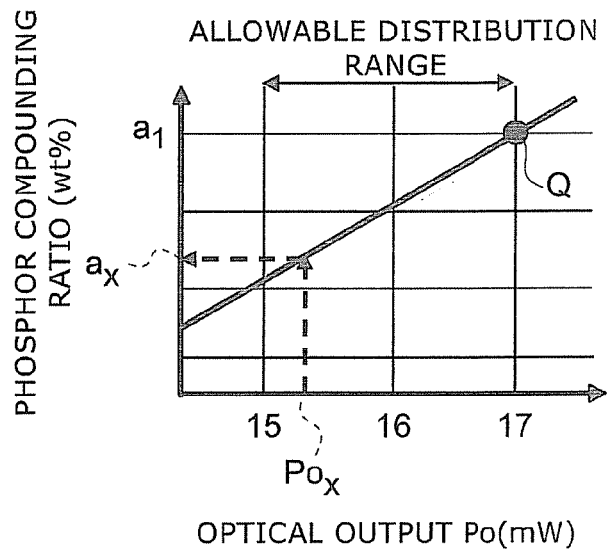
FIGS. 15A to 15C are views describing a method for calculating the weight of phosphor.
Figures 15B, 15C:
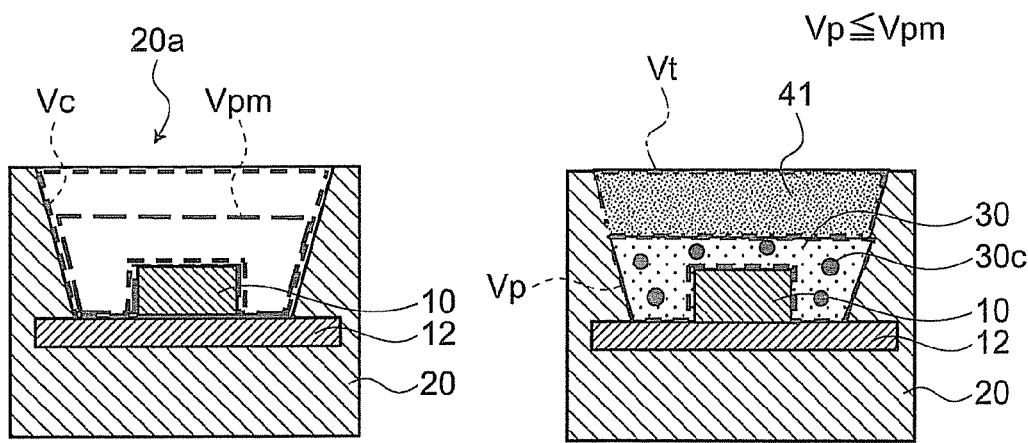

FIG. 15 illustrates a method for calculating the weight of phosphor particles. More specifically, FIG. 15A is a graph showing the optical output dependence of the phosphor compounding ratio for setting the chromaticity Cx of the wavelength-converted light to the target value 0.3 in the case where the wavelength Ld of the primary light is at the upper limit 460 nm, FIG. 15B illustrates the maximum volume of the mixed resin, and FIG. 15C is a schematic cross-sectional view showing the two-layer structure of the mixed resin and the translucent resin.

In FIG. 15A, the vertical axis represents the phosphor compounding ratio (wt %), and the horizontal axis represents the optical output Po (mW) of the primary light.

A group of N curves representing the phosphor compounding ratio ai as in FIG. 13A can be determined in the preliminary process. The dependence on the optical output of the primary light can be linearly approximated on the basis of the group of curves as shown in FIG. 15. At point Q corresponding to Po=17 mW and Ld=460 nm, the weight of phosphor particles is maximized, and hence the phosphor compounding ratio is also maximized ($a_1$).

In the measurement process of S106, it is assumed that the optical output $Po_x$ of the primary light emitted from the chip (light emitting element) is lower than the optical output upper limit, 17 mW. For simplicity of description, the wavelength Ld of the primary light is assumed to be at the upper limit, 460 nm. The phosphor compounding ratio ax corresponding to the optical output Pox is read from the optical output dependence of the phosphor compounding ratio. Here, the weight b of phosphor particles can be calculated by equation (1):

[Math.1]

$$b = Vpm \times d_x \times a_x \quad (1)$$

where

Vpm is the maximum volume (except the chip volume) of the recess (cup) that can be filled with the mixed resin, and $d_x$ is the density of the mixed resin having the phosphor compounding ratio $a_x$.

In the mounting process of the seventh embodiment, the phosphor compounding ratio is set to $a_1$, and the volume of the mixed resin is controlled. The volume Vp of the mixed resin having the phosphor compounding ratio a1 can be calculated by equation (2):

[Math.2]

$$Vp = b/(d_1 \times a_1) = Vpm \times (d_x \times a_x)/(d_1 \times a_1) \quad (2)$$

where $d_1$ is the density of the mixed resin having the phosphor compounding ratio $a_1$.

The phosphor compounding ratio $a_x$ being read off is smaller than the phosphor compounding ratio $a_1$ (maximum), and $d_x$ is smaller than $d_1$. Hence, the volume Vp of the mixed resin is less than the maximum volume Vpm (S108). That is, for each light emitting device, the volume Vp of the mixed resin is controlled so that the chromaticity Cx of the mixed light falls within the prescribed range.

In the above description with reference to FIG. 15, the wavelength Ld of the primary light is held constant at its upper limit 460 nm, but the invention is not limited thereto. In the case where the wavelength is varied while the optical output of the primary light is held constant at its upper limit 17 mW, the wavelength dependence of the phosphor compounding ratio can be determined on the basis of FIG. 13B. Then, equation (2) can be used to calculate the required weight b of phosphor particles and the volume of the mixed resin.

In FIG. 13A, the wavelength Ld of the primary light is set to the upper limit of the allowable distribution range, 460 nm, and in FIG. 13B, the optical output Po of the primary light is set to the upper limit of the allowable distribution range, 17 mW. In the range where the wavelength Ld of the primary light is shorter than 460 nm and the optical output Po is lower than 17 mW, the chromaticity Cx of the mixed resin is higher for the same phosphor compounding ratio, and hence the group of curves representing the optical output dependence and wavelength dependence is entirely shifted upward relative to FIG. 13. The group of these curves can be determined in S101 of the preliminary process.

In this case, the phosphor compounding ratio to achieve the same chromaticity can be determined using the curve shifted downward relative to the curve shown in FIG. 15.

Figure 14A:
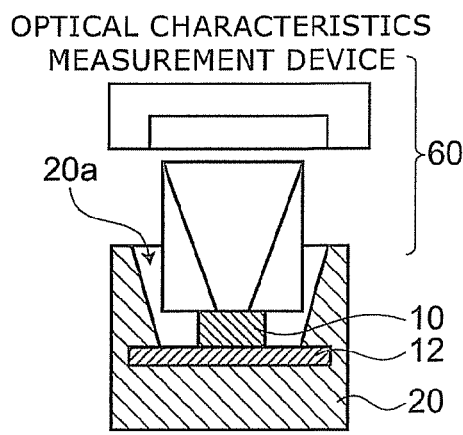
FIGS. 14A to 14D are process cross-sectional views of resin sealing.
Figure 14B:
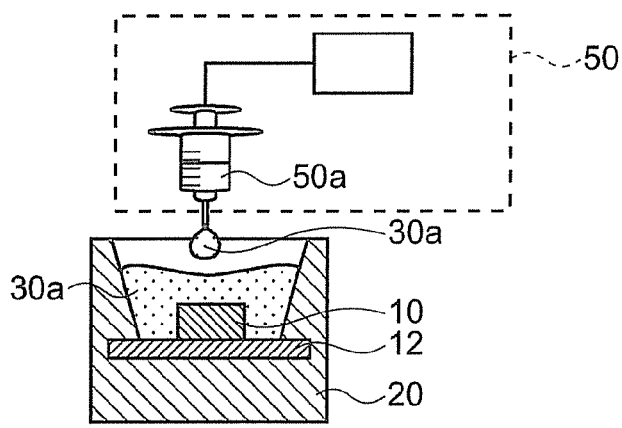

Subsequently, as in FIG. 14B, the mixed resin liquid 30a having the phosphor compounding ratio a1 in the amount corresponding to the volume Vp is discharged from the nozzle 50a of the ink jet device and dropped into the recess 20a (S110: the adjusting process). Alternatively, the dropping can be performed using a dispenser.

Figure 14C:
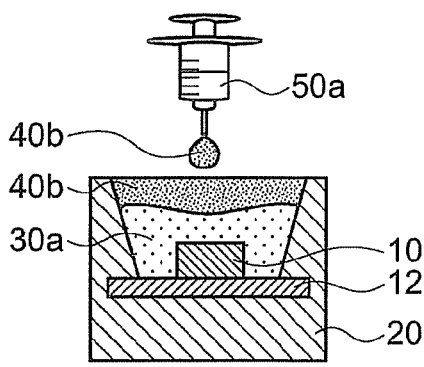
Figure 14D:
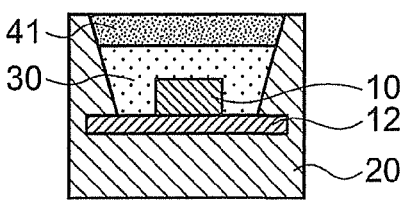

Furthermore, as in FIG. 14C, using another nozzle, the second translucent resin liquid 40a (having a refractive index n2, n2<n1 or n2=n1) containing no phosphor particles is dropped in the amount corresponding to volume Vt(=Vc−Vp). The second sealing layer 40 made of the second translucent resin 40b facilitates preventing the variation of directional characteristics of the emitted light due to the variation of the volume Vp of the first sealing layer 30. Here, Vc represents the volume of the recess 20a (cup) of the molded body 20.

Subsequently, a resin curing process is performed by heat treatment at 150 degrees centigrade for generally two hours, for example (S112). Thus, as in FIG. 14D, a light emitting device is completed in which the first sealing layer 30 and the second sealing layer 40 made of the second translucent resin 40b are stacked in the recess 20a. That is, as in FIG. 15C, it is possible to realize a two-layer structure of the first sealing layer 30 dispersed with phosphor particles 30c and the second sealing layer 40 without phosphor particles dispersed therein.

Alternatively, the phosphor weight b can be controlled also by switching to another nozzle having a different phosphor compounding ratio ai or by using a plurality of nozzles. In this case, it is easy to set the volume of the mixed resin liquid 30a generally to the maximum volume Vpm despite any variation in the wavelength Ld and optical output Po of the light emitting element 10.

Figure 16A:
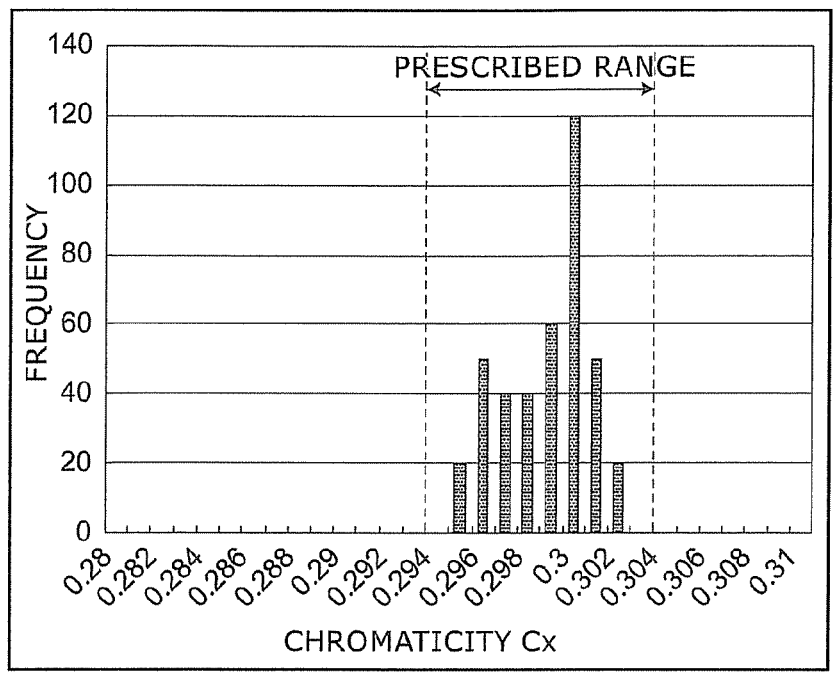
FIGS. 16A and 16B are graphs showing the frequency distribution of the chromaticity Cx of the mixed light.
Figure 16B:
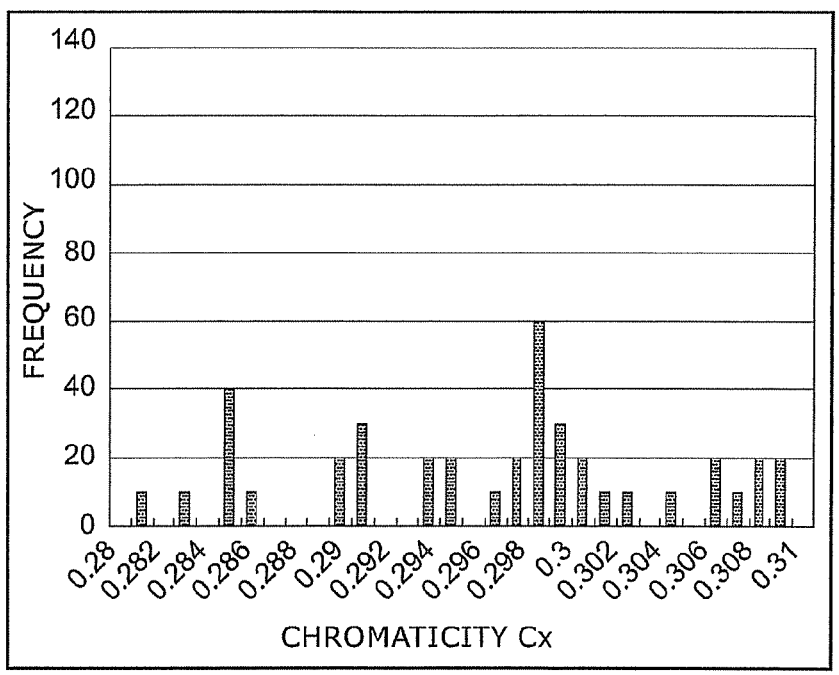

FIG. 16 is a graph showing the frequency distribution of the chromaticity Cx of the mixed light, in which FIGS. 16A and 16B correspond to this embodiment and the comparative example, respectively. The vertical axis represents frequency, and the horizontal axis represents the chromaticity Cx of the mixed light.

For the prescribed chromaticity range 0.294-0.304, the chromaticity Cx of the mixed light is controlled within the range of 0.296-0.303 in this embodiment shown in FIG. 16A. On the other hand, in the comparative example with no control of phosphor weight, the chromaticity Cx of the mixed light is widely distributed in the range of 0.281-0.312, and difficult to keep within the prescribed range. That is, the comparative example has large chromaticity variation and insufficient quality of optical characteristics of the mixed light. In contrast, this embodiment facilitates controlling the chromaticity, and provides a light emitting device with high quality of optical characteristics and a method for manufacturing a light emitting device with an improved conforming rate.

The example of FIG. 12 measures the wavelength and optical output of the primary light, and measures the dependence of the chromaticity of the mixed light on the wavelength and optical output of the primary light. However, the invention is not limited thereto.

For example, in the case where the wavelength of the primary light has a relatively small variation, the required amount of phosphor particles may be determined by measuring only the optical output of the primary light and measuring the dependence of the chromaticity of the mixed light on the optical output of the primary light. Conversely, in the case where the optical output of the primary light has a relatively small variation, the required amount of phosphor particles may be determined by measuring only the wavelength of the primary light and measuring the dependence of the chromaticity of the mixed light on the wavelength of the primary light.

Figure 17:
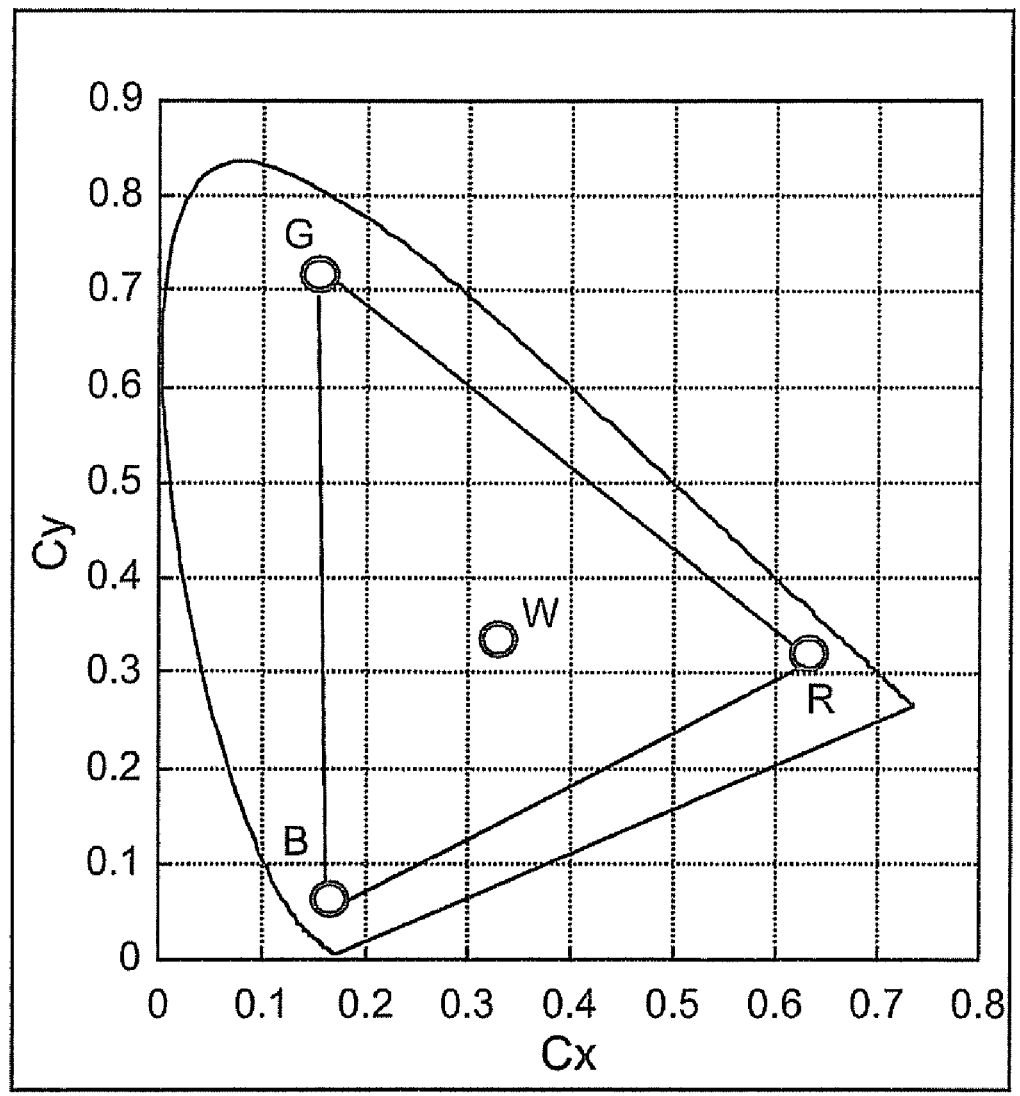
FIG. 17 is a chromaticity diagram describing a light emitting device according to an eighth embodiment.

FIG. 17 is a chromaticity diagram illustrating a light emitting device according to an eighth embodiment.

The light emitting device according to this embodiment can emit mixed light W of primary light B, which is the blue light emitted from a light emitting element 10 and has a wavelength range of 450-460 nm, wavelength-converted light G from a green phosphor illustratively made of a nitride material or YAG (yttrium aluminum garnet), and wavelength-converted light R from a red phosphor illustratively made of a nitride material or YAG.

Also in this case, the wavelength Ld and optical output Po of the blue primary light B distributed in the wafer are measured (S100 of FIG. 12), and the allowable distribution range thereof is defined.

Light emitting elements 10 in the defined allowable distribution range of wavelength Ld and optical output Po are extracted and used to assemble light emitting devices. Here, a suitable mixing ratio between the green phosphor and the red phosphor is defined so that the chromaticity of the mixed light W falls within a prescribed range. With this mixing ratio maintained, respective phosphor compounding ratios to the first mixed resin liquid 30a are varied to measure the chromaticity (Cx, Cy) of the mixed light W. Thus, the wavelength dependence and optical output dependence, for example, of the chromaticity of the mixed light are determined (S101).

These dependences are used to determine a green phosphor compounding ratio (maximum) and a red phosphor compounding ratio (maximum) that can serve as chromaticity target values at the upper limit of the allowable distribution range, i.e., Po=17 mW and L=460 nm for the primary light (S102). Thus, the preliminary process is completed.

Next, the process of assembling the light emitting device is performed. The light emitting elements 10 are each bonded to a package and subjected to wire bonding (S104). Subsequently, the wavelength Ld and optical output Po of the primary light of each light emitting element 10 are measured using an optical characteristics measurement device 60 such as a spectral device (S106).

The required weight of green phosphor particles and that of red phosphor particles are each calculated on the basis of the dependence of the chromaticity of the mixed light on the wavelength of the primary light and the dependence on the optical output, which are determined previously in the preliminary process, and the measurement values of the wavelength Ld and optical output Po of the primary light (S108).

The mixed resin liquid mixed with the required weight of phosphor particles is dropped from a nozzle (S110) and cured (S112). Thus, the assembling process is ended.

Figure 18A:
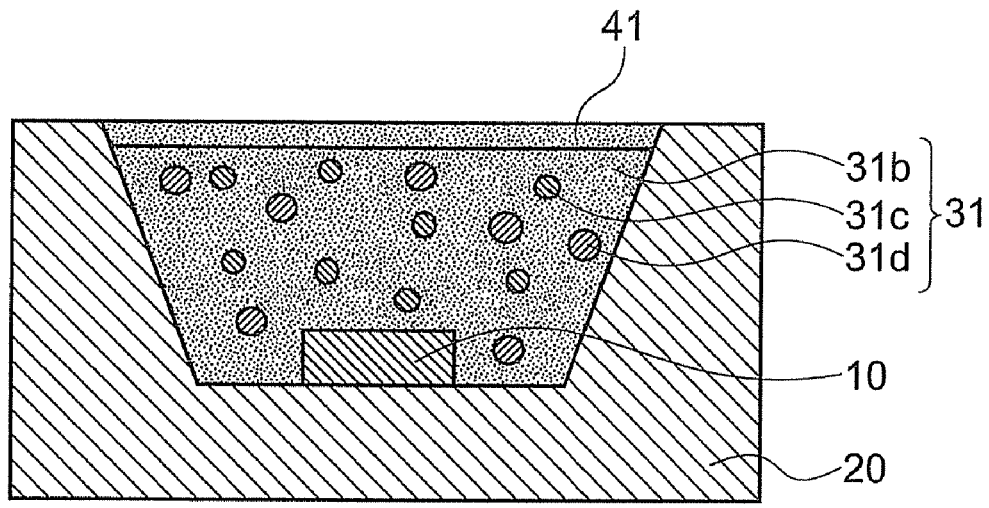
FIGS. 18A and 18B are schematic cross-sectional views of the light emitting device having two types of phosphor particles dispersed.
Figure 18B:
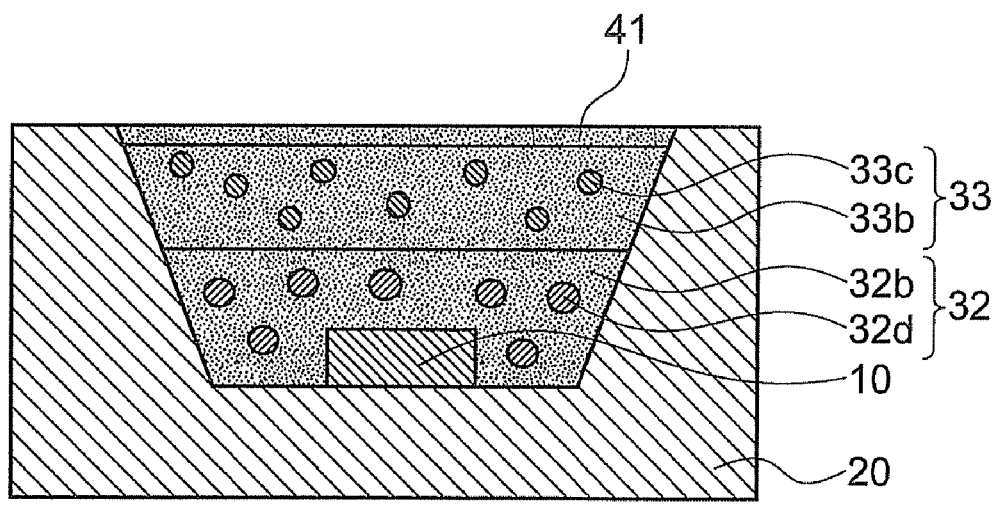

FIG. 18 is a schematic cross-sectional view of the eighth embodiment. More specifically, FIG. 18A shows a structure including a sealing layer 31 in which two types of phosphor particles are dispersed in a common translucent resin 31b, and FIG. 18B shows a structure including two sealing layers 32, 33 dispersed with respective types of phosphor particles.

The mixing ratio between the first phosphor particles 31c and the second phosphor particles 31d can be determined previously. In FIG. 18A, a mixed resin liquid having the determined mixing ratio between the phosphor particles 31c and 31d is prepared in an ink jet device 50. The required volume thereof is dropped so as to cover the light emitting element 10 and formed into a third sealing layer 31 by heat curing, for example. Alternatively, a mixed resin liquid containing the phosphor particles 31c and a mixed resin liquid containing the phosphor particles 31d may be separately prepared and dropped from separate nozzles. A second sealing layer 40 made of a translucent resin may be additionally provided on the third sealing layer 31.

In FIG. 18B, a mixed resin liquid is prepared by mixing the required weight of phosphor particles 32d in a translucent resin 32b and dropped on the chip of the light emitting element 10. Furthermore, a mixed resin liquid made of a translucent resin 33b mixed with the required weight of phosphor particles 33c is dropped. Then, a fourth and fifth sealing layer 32, 33 are formed by heat curing. Alternatively, after the fourth sealing layer 32 is formed by heat curing, the mixed resin liquid may be dropped thereon to form the fifth sealing layer 33. A second sealing layer 40 made of a translucent resin may be additionally provided on the fifth sealing layer 33. Thus, in the chromaticity diagram shown in FIG. 17, the mixed color W is easily controlled within the target chromaticity range.

The seventh and eighth embodiment can provide a light emitting device capable of emitting mixed light controlled within a prescribed chromaticity range, and a lighting device based thereon. For example, such light emitting devices of the laterally emitting type are arrayed to form a backlight source, which facilitates providing a display device having uniform chromaticity and high image quality.

Furthermore, the first embodiment and the seventh embodiment can be combined. More specifically, the dependence of the chromaticity of the mixed light on at least one of the wavelength and optical output of the primary light (emitted light from the light emitting element) is determined previously. At least one of the wavelength and optical output of the primary light is measured for each light emitting element. The required amount of phosphor particles for setting the chromaticity of the mixed light within a prescribed range is determined on the basis of the determined dependence of the chromaticity of the mixed light on at least one of the wavelength and optical output of the primary light, and the measured at least one of the wavelength and optical output of the primary light. A mixed solution containing the phosphor particles in the range of e.g. 90% or more of this required amount is filled so as to cover the light emitting element.

Here, while the light emitting element is caused to emit light and kept in a condition allowing the chromaticity of the mixed color to be measured, the mixed solution is further dropped until the chromaticity of the mixed color enters the prescribed chromaticity range. This can decrease the number of dropped shots of phosphor particles required to set the chromaticity of the mixed color within the prescribed chromaticity range, and chromaticity adjustment can be performed more rapidly. That is, a method for manufacturing alight emitting device with improved productivity is provided. In this case, the phosphor compounding ratios in the mixed solution may be equal or different.

The embodiments of the invention have been described with reference to the drawings. However, the invention is not limited to these embodiments. The material, size, shape, layout and the like of the translucent resin, phosphor particle, molded body, lead, and light emitting element constituting the light emitting device can be modified by those skilled in the art, and such modifications are encompassed within the scope of the invention as long as they do not depart from the spirit of the invention.

INDUSTRIAL APPLICABILITY

A light emitting device, and a method and an apparatus for manufacturing the same, in which the applied amount of phosphor particles is controlled and a mixed color with reduced chromaticity variation is possible to be emitted is provided. Use of this light emitting device allows a lighting device having uniform chromaticity and a display device having high image quality to be achieved.

The invention claimed is:

1. A method for manufacturing a light emitting device including a light emitting element and a mixed resin mixed with phosphor particles capable of absorbing an emitted light from the light emitting element and emitting wavelength-converted light, the light emitting device being operable to emit mixed light including the emitted light and the wavelength-converted light, the method comprising:

measuring at least one of each wavelength of the emitted light of the light emitting element while covering at least a surface of the light emitting element with the mixed resin, each optical output of the emitted light of the light emitting element, and each chromaticity of the mixed light emitted through the mixed resin after in a manufacturing process of the light emitting device; and adjusting chromaticity for each light emitting device by forming a scattering region in a surface neighborhood of the mixed resin or thereabove with regard to the mixed resin, on basis of a result obtained in the measuring, so that the chromaticity of the mixed light falls within a preset prescribed range, wherein the method further comprising;

previously determining dependence of chromaticity of the mixed light on at least one of wavelength of the emitted light and optical output of the emitted light, and determining a respectively required amount of the phosphor particles for setting the chromaticity of the mixed light within the prescribed range on basis of the determined dependence of the chromaticity of the mixed light, and the measured at least one of the wavelength and the optical output for each light emitting element, the adjusting including covering the light emitting element respectively with the mixed resin mixed with the required amount of the phosphor particles.

2. The method for manufacturing a light emitting device according to claim 1, wherein the forming the scattering region includes forming a roughened surface by irradiating the surface neighborhood of the first mixed resin or a surface neighborhood of a translucent resin provided on the first mixed resin with a plasma or ozone.

3. The method for manufacturing a light emitting device according to claim 1, wherein the forming the scattering region includes mixing scattering particles before a liquid translucent resin dropped on the first mixed resin is completely cured.

4. The method for manufacturing a light emitting device according to claim 1, further comprising, bonding the light emitting element in a recess provided on a packaging member, wherein the adjusting includes previously preparing the mixed resin having a prescribed compounding ratio in which a maximum value of a required amount of the phosphor particles is contained in a prescribed volume, on basis of the maximum value for setting the chromaticity of the mixed light within the prescribed range, the maximum value being determined in a case where at least one of the wavelength of the emitted light and the optical output of the emitted light has a predefined allowable upper limit value, and the prescribed volume for filling in the recess, and filling in the recess a necessary amount of the mixed resin having the prescribed compounding ratio in accordance with the required amount of the phosphor particles determined respectively for the light emitting element.

5. The method for manufacturing a light emitting device according to claim 4, further comprising, filling in the recess a translucent resin containing no phosphor particles and having a refractive index that is not more than the refractive index of the mixed resin, after filling in the recess a necessary amount of the mixed resin, the translucent resin being filled in an amount corresponding to a difference between a maximum volume that can be filled in the recess and a volume of the mixed resin that has already been filled.

6. The method for manufacturing a light emitting device according to claim 1, wherein the phosphor particles include two types, including first phosphor particles capable of emitting first wavelength-converted light and second phosphor particles capable of emitting second wavelength-converted light having a wavelength that is different from the wavelength of the first wavelength-converted light.

7. The method for manufacturing a light emitting device according to claim 1, wherein the covering the light emitting element includes discharging the mixed resin from a nozzle of an ink jet device.

8. The method for manufacturing a light emitting device according to claim 1, wherein the measuring further includes measuring the chromaticity of the mixed light in a state covered with the mixed resin, and the adjusting further includes filling by dropping the mixed resin additionally until the chromaticity falls within the preset prescribed range when the chromaticity of the mixed light measured in a state covered with the mixed resin is short to the preset prescribed range.

* * * * *